United States Patent [19]

Nishizawa et al.

[11] 3,990,902

[45] Nov. 9, 1976

[54] MAGNESIUM-TITANATE-COMPRISING SPINEL SINGLE CRYSTAL SUBSTRATE FOR SEMICONDUCTOR DEVICES

[75] Inventors: Jun-ichi Nishizawa; Mitsuhiro Kimura, both of Sendai, Japan; Tohoku Metal Industries Limited, both of Sendai, Japan

[73] Assignee: Semiconductor Research Foundation

[22] Filed: July 29, 1975

[21] Appl. No.: 600,007

[30] Foreign Application Priority Data
Aug. 2, 1974   Japan.............................. 49-89280

[52] U.S. Cl............................... 106/73.3; 106/73.4
[51] Int. Cl.² .................... C04B 35/44; C04B 35/46
[58] Field of Search..................... 106/46, 73.3, 73.4

[56] References Cited
UNITED STATES PATENTS

| | | | |
|---|---|---|---|
| 2,436,840 | 3/1948 | Wainer | 106/73.3 |
| 2,691,088 | 10/1954 | Ungewis | 106/73.3 |
| 3,531,308 | 9/1970 | Bagley | 106/73.4 |
| 3,713,877 | 1/1973 | Kirchner | 106/73.3 |

*Primary Examiner*—Winston A. Douglas
*Assistant Examiner*—Mark Bell
*Attorney, Agent, or Firm*—Flynn & Frishauf

[57] ABSTRACT

A spinel single crystal substrate for epitaxial growth thereon of a semiconductor layer to manufacture semiconductor devices. Magnesium titanate is substituted for at least a portion of magnesium aluminate of which the spinel essentially consist in general. A preferred mol ratio of the magnesium titanate to the magnesium aluminate is between 5:95 and 40:60 when a silicon layer is to be epitaxially grown on the substrate as the semiconductor layer.

6 Claims, 3 Drawing Figures

MAGNESIUM-TITANATE-COMPRISING SPINEL SINGLE CRYSTAL SUBSTRATE FOR SEMICONDUCTOR DEVICES

BACKGROUND OF THE INVENTION

This invention relates to a spinel single crystal substrate of the magnesium aluminate class for epitaxial growth thereon of a semiconductor layer. The substrate according to this invention therefore is for use in manufacturing semiconductor devices by the use of the epitaxially grown semiconductor layer.

A substrate of an electrically insulating material for epitaxial growth thereon of a semiconductor layer is theoretically welcomed because the substrate affords excellent electric insulation between the semiconductor device elements manufactured by the use of the semiconductor layer and eliminates the undesirable parastic capacity to thereby reduce the power consumption, enable the semiconductor devices to be manufactured in the form of an integrated circuit, and improve the high-frequency performance. A conventional insulator substrate consisting either of a sapphire or a spinel single crystal, however, shows appreciable mismatch as will be described hereunder with reference to FIG. 1 of the accompanying drawing between the crystal lattices of the substrate and the semiconductor single crystal epitaxially grown thereon in the form of the layer as called herein. It follows therefore that the mismatch seriously damages the electric characteristics of the semiconductor devices to reduce the yield of the products. In addition, the component aluminium of the sapphire or spinel tends to diffuse into the epitaxially growing semiconductor layer to render the thereby grown semiconductor single crystal heterogeneous.

An is known in the crystallography, spinel crystals consist essentially of magnesium aluminate which may be represented in chemical formula by $MgO.nAl_2O_3$ wherein the mol ratio n of $Al_2O_3$ to $MgO$ is from unity to about four. A spinel crystal of this essential composition is termed herein a magnesium aluminate class spinel crystal.

In the meantime, Jun-ichi Nishizawa, one of the instant inventors, has proposed in Japanese Patent Application No. 47-74483 filed on July 25, 1972, and laid open to public on Mar. 28, 1974, to reduce the mismatch in question by changing the composition of at least one of the substrate and the semiconductor. In conjunction with a combination of a spinel substrate and a silicon layer formed thereon, it is described in the referenced Japanese patent application, among others, that the spinel should preferably have a larger lattice constant, that a greater lattice constant is expected to result from introduction into a spinel of at least one metal element selected from a group consisting of magnesium, nickel, tin, germanium, silicon, titanium, zirconium, hafnium, and beryllium, that a magnesium aluminate class spinel including MgO in excess, having the above-mentioned at least one element at the magnesium site, such as $Sn_{1-x}Mg_xO.Al_2O_3$, or having the above-mentioned at least one element at the aluminium site, such as $MgO.(Al_{1-x}Si_x)_2O_3$, is expected to serve well, that addition to a magnesium aluminate class spinel of another spinel, such as $TiZn_2O_4$ whose lattice constant is said to be a = 8.445 A, is thought to be effective, and that addition to a spinel of a chemical element of Group IV, such as silicon, germanium, or tin, is believed to be harmless to the silicon layer even autodoped. The specification of the referenced application thus points out verious possibilities but does not definitely teach as for the magnesium aluminate class spinel what substance should be added thereto in what quantity.

SUMMARY OF THE INVENTION

It is therefore an object of the present invention to provide a magnesium aluminate class spinel single crystal substrate for epitaxial growth thereon of a semiconductor layer, which will not adversely affect the electric characteristics of semiconductor devices manufactured on the substrate by the use of the semiconductor layer.

It is another object of this invention to provide a spinel single crystal substrate of the type described, with which it is possible to raise the yield of the resulting semiconductor devices.

It is still another object of this invention to provide a spinel single crystal substrate of the type described, with which it is possible to render the semiconductor single crystal of the epitaxially grown semiconductor layer homogeneous.

It is a specific object of this invention to provide a spinel single crystal substrate of the type described, wherein a particular substance is definitely used to achieve the objects of this invention enumerated in the three next preceding paragraphs.

It is a more specific object of this invention to provide a spinel single crystal substrate of the type described, on which a most perfect and homogeneous possible silicon single crystal may be epitaxially grown even in a very thin layer.

It is another more specific object of this invention to provide a spinel single crystal substrate of the type described, which is not bent even a thick silicon layer is epitaxially grown thereon.

In accordance with this invention there is provided a substrate consisting of a magnesium aluminate class spinel single crystal for epitaxial growth thereon of a semiconductor layer, wherein magnesium titanate is substituted for at least a portion of magnesium aluminate of the spinel.

DESCRIPTION OF THE PREFERRED EMBODIMENTS

Figure 1:
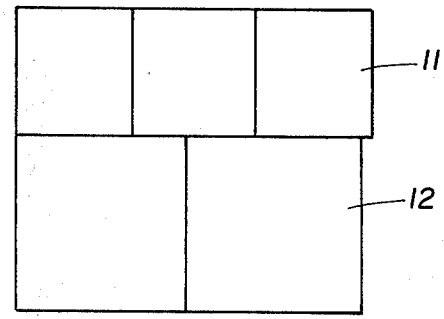
FIG. 1 schematically shows a portion of a spinel single crystal substrate and a silicon layer epitaxially grown thereon on an extremely enlarged scale.

Referring to FIG. 1, the lattice constant along each (1 0 0) crystallographic plane of a spinel single crystal 11 consisting of stoichiometric mol ratio of $Al_2O_3$ to $MgO$ is 8.084 A while that along each (1 0 0) plane of a silicon single crystal 12 is 5.430 A. It follows therefore that two unit cells of the spinel crystal lattice approximately match three unit cells of the silicon crystal lattice. There is, however, a small mismatch depicted in FIG. 1 between the crystal lattices of the spinel and silicon. Although small, the mismatch results, when a silicon layer is actually epitaxially grown on a magnesium aluminate class spinel single crystal substrate, in a bend of the substrate, stress latent in the silicon crystal lattice, and dislocation in the silicon crystal. The mismatch thus adversely affects as described in the preamble of the instant specification the electric characteristics of the semiconductor devices manufactured by the use of the silicon layer. In addition, the aluminium renders the silicon crystal heterogeneous as also set forth in the preamble. This makes a semiconductor crystal formed in a very thin layer on a conventional substrate of magnesium aluminate class spinel single crystal unsuitable to manufacture of large-scale integrated circuits. In order to quantitatively speak of the degree of mismatch, a misfit coefficient is defined herein for the combination of silicon and a magnesium aluminate class spinel by:

$$\frac{a_{Si} \times 3 - a_{Sp} \times 2}{(a_{Si} \times 3 + a_{Sp} \times 2)/2},$$

where $a_{Si}$ and $a_{Sp}$ represent the lattice constants of silicon and the spinel. By using the above-cited numerical values of the respective constants, the misfit coefficient for silicon and the spinel of stoichiometric mol ratio of $Al_2O_3$ to $MgO$ is 0.00755, namely, 0.755 percent. As the mol ratio increases, the lattice constant of the magnesium aluminate class spinel decreases with the result that the misfit coefficient increases.

Figure 2:
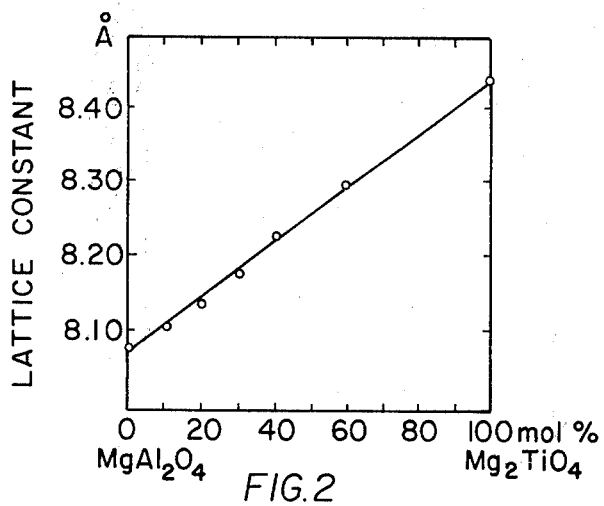
FIG. 2 shows the lattice constants of a conventional magnesium aluminate spinel single crystal and of various magnesium aluminate class spinel single crystal substrates according to the instant invention.

Referring to FIG. 2, it has now been determined that the lattice constant of the magnesium aluminate class spinel varies as shown therein when magnesium titanate, $Mg_2TiO_4$, is substituted for from 0 to 100 mol percent of magnesium aluminate of the spinel. Furthermore, it has been confirmed that the resulting composition forms a single crystal of the spinel structure. From FIG. 2, the mol ratio of the magnesium titanate to the magnesium aluminate should approximately be between 5:95 and 40:60 in order to reduce the misfit coefficient below 0.755 percent although the mol ratio in question may differ more or less as a result of variations in the lattice constant of the silicon crystal depending on the conditions for the epitaxial growth and in the lattice constant of the spinel single crystal.

A single crystal for a substrate according to this invention is produced by a conventional method of crystal growth. When the crystal is grown from a molten mass of a desired composition, heating may be carried out by any of the conventional methods, such as high-frequency heating, infrared-ray heating, oxyhydrogen flame heating, and others. The crystal may be grown by the floating zone method, Czochralski method, or edge-defined film fed growth (EFG) method. Alternatively, the single crystal may be grown by the chemical deposition method.

More particularly, powder was prepared which consisted essentially of $MgAl_2O_4$ and 20 mol percent of $Mg_2TiO_4$, thoroughly mixed, and pressed into a mass of a rod shape. The mass was sintered in air at 1300° C for 5 hours into a ceramic rod. With a seed crystal and an infrared-ray furnace having a pair of ellipsoidal reflectors, the floating zone method was resorted to so as to grow a single crystal on the seed crystal from the ceramic rod at a rate of crystal growth of 1 mm/hour and with the rod rotated at 90 r.p.m. The grown crystal was of homogeneous composition all over, showed an X-ray diffraction peak (4 4 4) of a half-value angle of about 30'', and had a melting point at 2050° C. The distribution coefficient of $Mg_2TiO_4$ in the single crystal to that in the liquid phase was 0.5. It is possible to raise the distribution coeffficient towards unity by selecting an optimum rate of crystal growth from higher rates achieved by the EFG method. Also, it is possible with the Czochoralski or the like method to augment the hemogeneity of the spinel single crystal by adjusting the composition of the molten mass during the crystal growth.

By the use of a substrate made of the spinel single crystal produced as above by adoption of the floating zone method, a silicon single crystal was grown from the vapor phase produced by thermal decomposition of monosilane. The silicon single crystal was very perfect even at the interface near the substrate so that the crystal is suitable to manufacture of SOS or MOS semiconductor devices and memory devices comprising such semiconductor devices. The substrate was not bent even a thick silicon layer was formed thereon. With the thickness of the silicon single crystal layer of about one micron, the mobility along the (1 1 1) crystallographic plane of the silicon crystal was 300 $cm^2/Vsec$ or more at a carrier concentration below $2 \times 10^{15} /cm^3$.

Figure 3:
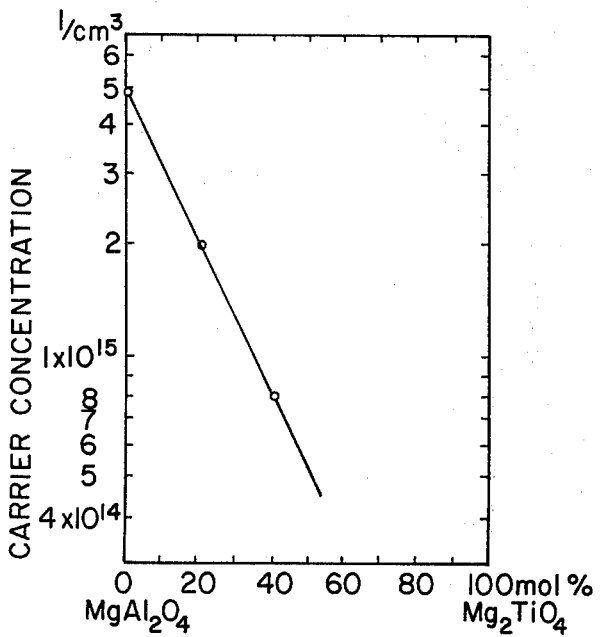
FIG. 3 shows carrier concentrations in silicon single crystals epitaxially grown on a conventional magnesium aluminate spinel substrate and on several magnesium aluminate class spinel single crystal substrates according to this invention.

Referring to FIG. 3, the carrier concentrations in silicon single crystal layers epitaxially grown without doping on various magnesium aluminate class spinel single crystal substrates are depicted versus the mol ratios of the magnesium titanate to the magnesium aluminate. It is possible by selecting pertinent mol ratios to reduce the amount of aluminium undesirably diffusing into the silicon layer through autodoping as far as possible. It has been proven with the above-mentioned preferred mol ratio range that the single crystal of the silicon layer is scarcely adversly affected by the autodoping of magnesium and titanium.

As can be seen from the measurement of the electric characteristics, substrates according to this invention with a mol ratio of the magnesium titanate to the magnesium aluminate selected between 5:95 and 40:60, provide epitaxially grown silicon layers of excellent electric characteristics in practice. With the mol ratio selected between 12:88 and 30:70, the misfit coefficient is further reduced to 0.4 percent or less. As a result, the silicon crystal is perfect and homonegeous even though the layer is thin so that the substrates are well adapted to manufacture of large-scale integrated circuits.

For a germanium layer epitaxially grown on a magnesium aluminate class spinel single crystal substrate according to this invention, the mol ratio of the magnesium titanate to the magnesium aluminate should be 96.5:3.5 or more in mere view of the misfit coefficient, which decreases to 0.55 percent when the magnesium titanate is substituted for entire magnesium aluminate. A mol ratio of 5:5, however, is preferred because of the adverse effects that results from high percentage of the titanium content. For a gallium arsenide layer, the mol ratio should be 95:5 or more and decreases to 0.47 percent when the mol percentage of the magnesium titanate reaches 100. The preferred mol ratio is, however, 5:5 also in this case. For gallium phosphide, the misfit coefficient of a spinel single crystal of the stoichiometric mol ratio of $Al_2O_3$ to $MgO$ is somewhat greater than 1.12 percent. To attain a misfit coefficient equal to or smaller than 1.12 percent, the mol ratio of the magnesium titanate to the magnesium aluminate should be between 1:99 and 46:54. To further reduce the misfit coefficient to 0.4 percent or less, the latter mol ratio should be between 17:83 and 36:64. It will now be easy for those skilled in the art to select according to the present invention and depending on the particular semiconductor material of which a single crystal layer is to be formed on a substrate the mol ratio of the magnesium titanate to the magnesium aluminate for the substrate to give the best possible results.

What is claimed is:

1. In a substrate consisting of a magnesium aluminate class spinel single crystal for epitaxial growth thereon of a semiconductor layer, the improvement wherein magnesium titanate is substituted for at least a portion of magnesium aluminate of the spinel.

2. A substrate as claimed in claim 1, wherein a mol ratio of the magnesium titanate to the magnesium aluminate is between 5:95 and 40:60, whereby said substrate is adapted to epitaxial growth thereon of a silicon layer as said semiconductor layer.

3. A substrate as claimed in claim 2, wherein said mol ratio is between 12:88 and 30:70.

4. A substrate as claimed in claim 1, wherein a mol ratio of the magnesium titanate to the magnesium aluminate is approximately 5:5, whereby said substrate is adapted to epitaxial growth thereon of one of a germanium layer and a gallium arsenide layer as said semiconductor layer.

5. A substrate as claimed in claim 1, wherein a mol ratio of the magnesium titanate to the magnesium aluminate is between 1:99 and 46:54, whereby said substrate is adapted to epitaxial growth thereon of a gallium phosphide layer as said semiconductor layer.

6. A substrate as claimed in claim 5, wherein said mol ratio is between 17:83 and 36:64.

* * * * *

UNITED STATES PATENT OFFICE
CERTIFICATE OF CORRECTION

Patent No. 3,990,902                 Dated   November 9, 1976

Inventor(s) JUN-ICHI NISHIZAWA et al

It is certified that error appears in the above-identified patent and that said Letters Patent are hereby corrected as shown below:

Title page, left column, the line bearing the identification "[73]" should read as follows:

--[73]  Assignees:  Semiconductor Research Foundation
                               and Tohoku Metal Industries Limited--

Signed and Sealed this

Eighth Day of February 1977

[SEAL]

Attest:

RUTH C. MASON
*Attesting Officer*

C. MARSHALL DANN
*Commissioner of Patents and Trademarks*